United States Patent [19]
Nakamoto et al.

[11] Patent Number: 5,187,451
[45] Date of Patent: Feb. 16, 1993

[54] OSCILLATOR USING MICROSTRIP LINE HAVING MINIMIZED LINE WIDTH AND LENGTH

[75] Inventors: Yasuhiro Nakamoto, Kokubu; Hiroki Uemura, Miyakonojo, both of Japan

[73] Assignee: Kyocera Corporation, Kyoto, Japan

[21] Appl. No.: 613,721

[22] Filed: Jan. 28, 1991

[30] Foreign Application Priority Data

Mar. 31, 1989 [JP] Japan .................................... 1-82075

[51] Int. Cl.$^5$ .......................... H03B 5/18; H03B 7/14; H03C 3/22
[52] U.S. Cl. ...................................... 331/99; 331/115; 331/117 D; 331/177 V; 332/130; 332/136
[58] Field of Search ...................... 331/96, 99, 107 SL, 331/117 D, 177 V, 115; 332/130, 136

[56] References Cited
U.S. PATENT DOCUMENTS 4,694,262  9/1987  Inoue et al. ............... 331/96

FOREIGN PATENT DOCUMENTS

59-134904  8/1984  Japan .
1-277008  11/1989  Japan .

*Primary Examiner*—Siegfried H. Grimm
*Attorney, Agent, or Firm*—Spensley Horn Jubas & Lubitz

[57]     ABSTRACT

For minimization of a microstrip line and improvement of a Q value, the line length and width of the microstrip line are minimized, and the high frequency trend of the resulting resonant frequency is lowered and corrected to the resonant frequency near the oscillation frequency of an oscillator by connecting an additional capacitance component to the microstrip line. Thereby, the minimization of the microstrip line or the minimization of an oscillation circuit and characteristics equivalent to a dielectric coaxial resonator may be readily obtained. The strip line and the additional capacitance component are made as one piece circuit elements. The microstrip line is connected with a stub such that the stub may be trimmed to adjust the oscillation frequency. A cascode connecting amplifier which lessens the oscillation frequency fluctuation due to load variations is used.

4 Claims, 10 Drawing Sheets

OSCILLATOR USING MICROSTRIP LINE HAVING MINIMIZED LINE WIDTH AND LENGTH

BACKGROUND OF THE INVENTION

1. Technical Field

The present invention relates to an oscillation circuit using a microstrip line such as a voltage control oscillation circuit (hereinafter referred to as VCO). More particularly, it relates to the VCO having a resonant circuit of the microstrip line whose line width and line length are minimized, in which the microstrip line and an additional capacitance component are made as one piece circuit elements, and furthermore the oscillation frequency is adjusted by trimming a stub with the microstrip line connected with the stub, and a cascode connecting amplifier which lessens the oscillation frequency fluctuation due to load variations is used.

2. Technical Background

Conventionally, it has been known widely that a VCO used in mobile communications, for example, in a car telephone or a satellite communications system, comprises a microstrip line and a dielectric coaxial resonator as a resonator of a resonant circuit.

However, an oscillator using the microstrip line has, in general, a poor C/N ratio (C: carrier wave, N: noise) as compared with the oscillator using the dielectric coaxial resonator, so that (excluding a portion of consumer products in which more importance is attached to a cost), in practice, the dielectric coaxial resonator is widely used.

Figures 6, 7:
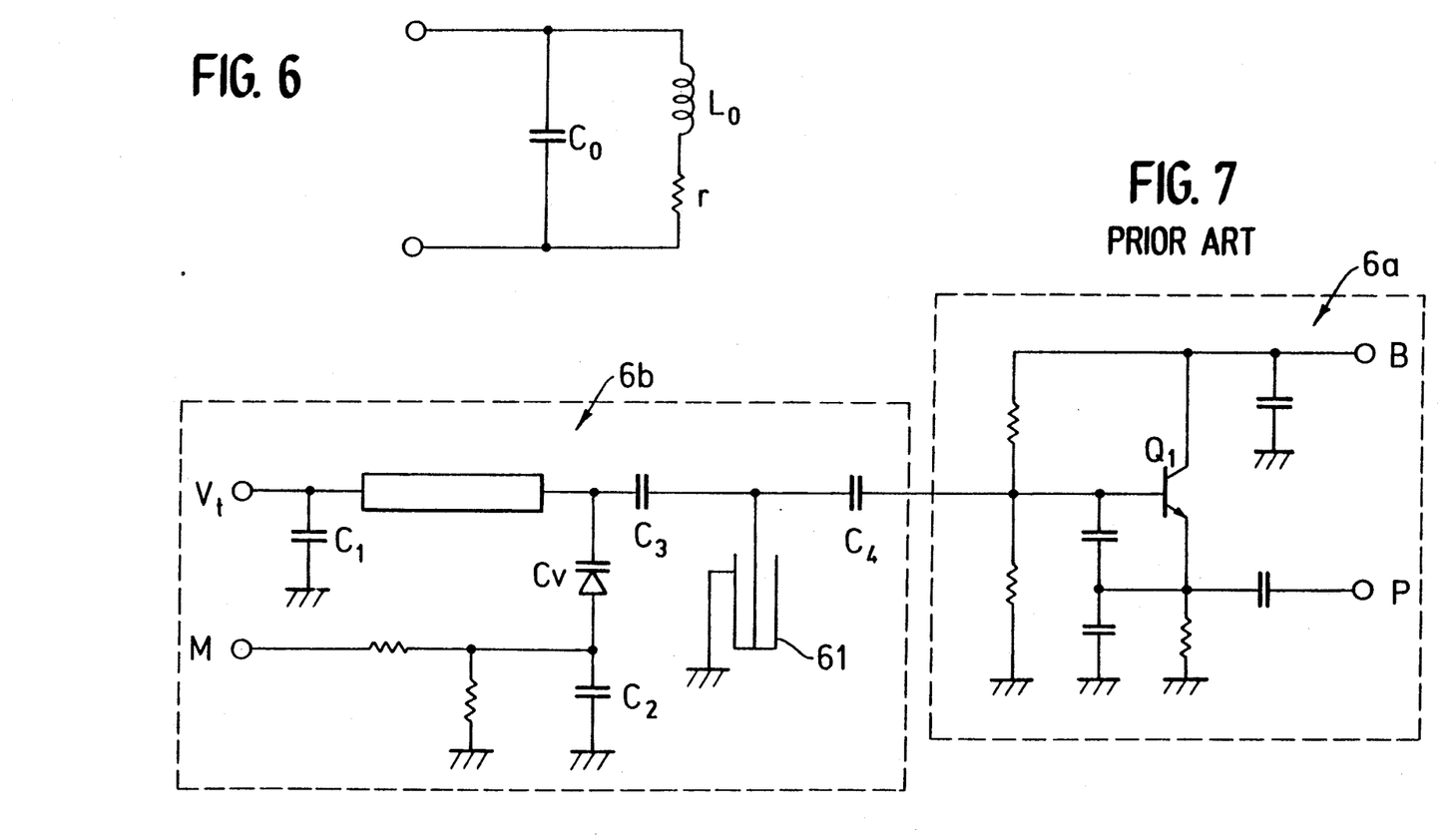
FIG. 6 is an equivalent circuit diagram when a conductor resistance of a microstrip line is considered.
FIG. 7 is a circuit diagram of an oscillation circuit having a dielectric coaxial resonator in a conventional resonant circuit.

FIG. 7 is an electric circuit diagram of the VCO having the resonant circuit of a dielectric coaxial resonator.

The VCO is a Colpitts oscillation circuit consisting of a negative resistance circuit 6a having an active element and a resonant circuit 6b having a dielectric coaxial resonator 61.

The VCO has a terminal Vt which is a control voltage terminal, a terminal M which is a modulation terminal, a terminal B which is a power terminal and a terminal P which is an output terminal.

A transistor Q1 is collector grounded by the negative resistance circuit 6a having the active element.

The resonant circuit 6b has a dielectric coaxial resonator 61, a variable capacitor Cv whose capacity varies by control voltages, bypass capacitors C1, C2, a capacitor C3 for determining the variable range of the voltage control oscillation frequency and a clap capacitor 4 and so on.

Figure 8A:
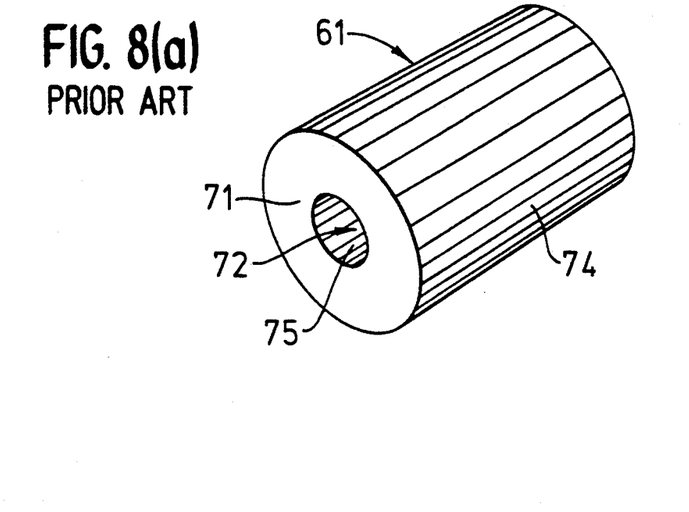
FIG. 8(a) is a perspective view showing an example of a conventional dielectric coaxial resonator.

The dielectric coaxial resonator 61 used in such a resonant circuit 6b, as shown in FIG. 8(a), has a through hole 72 extending to the bottom from the upper surface 71 of a dielectric block, on the side of which is an outer conductor 74 and on the inner surface of the through hole 72 is an inner conductor 75. On the opposite surface (not shown) of the upper surface 71, the outer conductor 74 and the inner conductor 75 are interconnected. These conductors 74 and 75 may be formed of silver or other suitable materials.

When the length of the dielectric coaxial resonator 61 is designated at $l_0$, resonance takes place when the frequency is $\frac{1}{4}\lambda g$ ($\lambda g$: guide wave length along line), and at $l_0 < \frac{1}{4}\lambda g$ showing an inductivity which is utilized by the VCO as the inductance of the resonant circuit for oscillation.

Figure 8B:
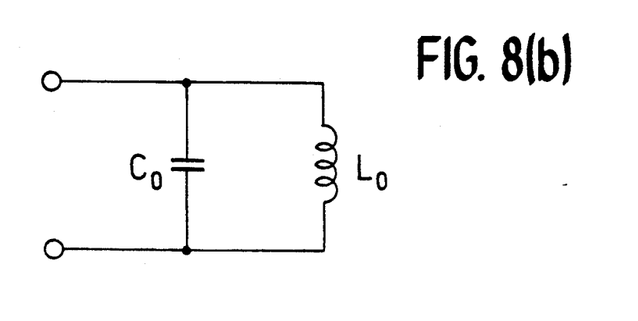
FIG. 8(b) is its equivalent circuit diagram.

The relationship between the wave length $\lambda g$ where the dielectric coaxial resonator resonates and the length $l_0$ of the dielectric coaxial resonator 61 is an equivalent circuit of FIG. 8(b) and may be represented as, $$l_0 = \frac{1}{4}(2n - 1)\lambda g \qquad (1)$$

$$\lambda g = \frac{c}{f_0 \sqrt{\epsilon_r}} \qquad (2)$$

where,
c: velocity of light in free space
$f_0$: resonant frequency
$\epsilon_r$: relative dielectric constant
n: arbitrary integer Here, when the dielectric coaxial resonator 61 having the dielectric constant $\epsilon_r$ of 90 is used to set the resonant frequency $f_0$ at 900 MHz, the length $l_0$ becomes about 8.8 mm. Equivalent inductance $L_0$ at this time is about 1.55 nH and the equivalent capacitance $C_0$ is about $20_pF$.

Figure 9:
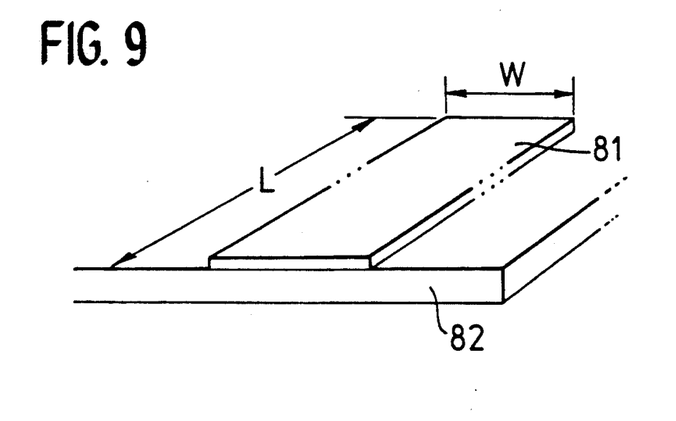
FIG. 9 is a partial perspective view of an arrangement when a conventional resonant circuit is replaced with a microstrip line.

However, since the size of dielectric coaxial resonator 61 practically results in an electronic component of about 1 cm square and since the dielectric coaxial resonator must be soldered precisely onto a predetermined oscillation circuit substrate (not shown), there is such a disadvantage of complicating the mounting process and restricting the minimization of the entire oscillation circuit. It is also considered to replace the dielectric coaxial resonator 61 (impedance $Z_0 = 6\Omega$, dielectric constant $\epsilon_r = 90$) of the resonant circuit 6b with a microstrip line 81 as shown in FIG. 9. The microstrip line 81 equivalent to the aforesaid dielectric coaxial resonator 61 corresponds to those formed on a dielectric substrate 82 (alumina substrate of dielectric constant $\epsilon_r = 9.6$) by a conductor having the line width W of 9 mm and the line length L of 28.7 mm.

That is, forming the microstrip line 81 equivalent to the aforesaid dielectric coaxial resonator 61 practically on the dielectric substrate 82, for example, by a thick film process, considerably hinders the practical size minimization of the oscillation circuit, since the line width W of the microstrip line 81 becomes very wide, for example 9 mm.

When the line width W is narrowed to minimize the size of the microstrip line 81, a conductor resistance increases and a Q value is lowered. This eventually results in a resonant circuit having a poor selectivity and, thus, thereby noises near the oscillation frequency which are difficult to restrain or reduce.

Figure 5:
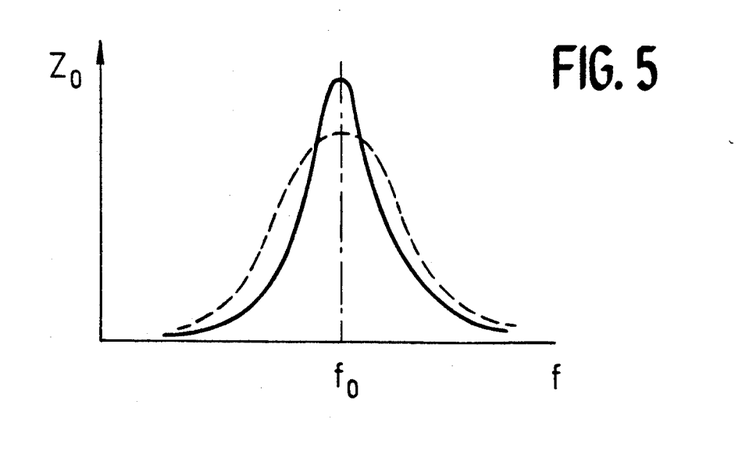
FIG. 5 is a graph showing the relationship between a resonant frequency and a resonant impedance of a microstrip line.

In general, when the line width W of the microstrip line 1 is narrowed, as shown by the broken line in FIG. 5, the resonance impedance is lowered as compared with the case shown in the unbroken line, resulting n a gentle graph.

When the line width W is eventually reduced to make the microstrip line compact in size, the reduction of the Q value and the increment of the conductor resistance are developed and practical minimization becomes impossible. Thus, a resonator having equivalent or better characteristics than a dielectric coaxial resonator was not accomplished.

SUMMARY OF THE INVENTION

The present invention has been devised in view of the problems described above. It is an object of the invention to provide an oscillation circuit having a microstrip line in a resonant circuit, in which similar characteristics as those of a dielectric coaxial resonator are obtained and size minimization can be accomplished.

Specific means for achieving the aforesaid object and other objects are provided according to an embodiment of the invention, by an oscillation circuit comprising a resonant circuit having a microstrip line and a negative resistance circuit having an active element, and by constituting the microstrip line by minimizing the line width and length to form a high conductivity conductor on a low dielectric constant substrate, grounding one end of the microstrip line and connecting the other end thereof to an additional capacitance component, setting the resonant frequency of the solid microstrip line sufficiently higher than the oscillation frequency of the oscillation circuit, for example, to the frequency in a GHz zone of more than two times the oscillating frequency, and reducing the resonant frequency near to the oscillation frequency of the oscillation circuit by the additional capacitance component.

Also, such objects can be accomplished by forming the microstrip line of an embodiment of the invention and the additional capacitance component on the low dielectric constant substrate as one piece circuit elements.

Moreover, in order to facilitate adjustment of the oscillation frequency, a stub is trimmed on the microstrip line to which the stub is connected.

In addition, in order to minimize the oscillation frequency fluctuation against a load variation, a cascode connecting amplifier is used.

BEST MODE FOR CARRYING OUT THE INVENTION

An oscillation circuit of an embodiment of the present invention will be described particularly with reference to the drawings as follows.

Figure 1:
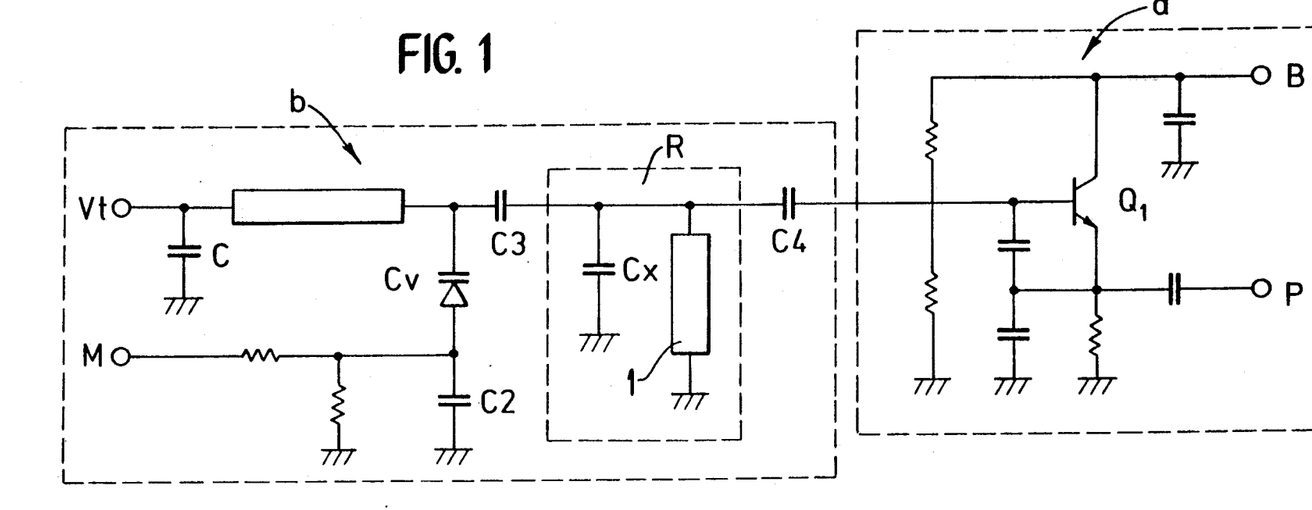
FIG. 1 is a circuit diagram of an oscillation circuit having a microstrip line according to one embodiment of the invention in a resonant portion.

FIG. 1 is a circuit diagram of an oscillation circuit having a microstrip line according to an embodiment of the invention.

The oscillation circuit comprises a negative resistance circuit a having an active element and a resonant circuit b having a microstrip line 1.

The negative resistance circuit a having the active element is constituted by collector grounding an amplifying transistor $Q_1$. A terminal B of the amplifying portion a is a power terminal and a terminal P is an output terminal.

The resonant circuit b comprises the microstrip line 1, an additional capacitance component Cx, a variable capacitor Cv whose capacity varies by the control voltage, bypass capacitors C1, C2, a capacitor C3 for determining variable ranges of the voltage control oscillation frequency, a clap capacitor C4 and so on. A terminal Vt of the resonant circuit b is a control voltage terminal and a terminal M is a modulation terminal.

Figure 2A:
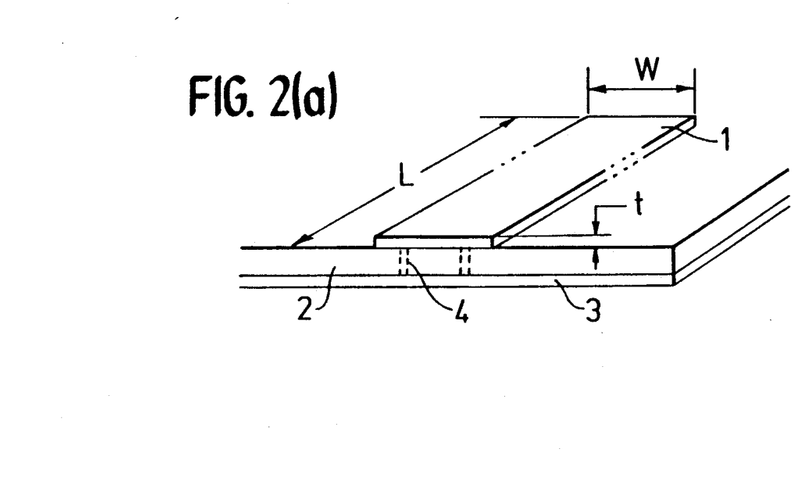
FIG. 2(a) is a perspective view of a microstrip line used in an oscillation circuit of an embodiment of the invention.

The microstrip line 1 of the resonant circuit b is, as shown in FIG. 2(a), constituted by forming a conductor having the line width W and length L much smaller than the conventional one on an inexpensive low dielectric constant substrate such as an alumina substrate 2. The conductor is preferably a high conductivity material such as copper.

Also, on the bottom side of the substrate 2 whereon the microstrip line 1 is formed, a ground conductor 3 is formed and one end of the microstrip line 1 is connected to the ground conductor 3 via a through hole 4.

Moreover, an additional capacitance component Cx is connected to the microstrip line 1.

The additional capacitance component Cx is for reducing the excessively high resonant frequency $f_1$ of the microstrip line 1 accomplished by the minimization of the microstrip line 1, to an anticipated resonant frequency $f_0$ near the oscillation frequency of the oscillation circuit. The additional capacitance component Cx is provided by connecting capacitance components of a one piece capacitor 5 to the other end of the microstrip line 1.

In deciding the line width W and length L of the microstrip line 1, the resonant frequency $f_0$ is anticipated at 900 MHz.

When the conventional dielectric coaxial resonator 61 is used,

| characteristic impedance $Z_0$ | 7 Ω |
|---|---|
| equivalent inductance $L_0$ | 1.55 nH |
| equivalent capacitance $C_0$ | 20 pF, | therefore, the line width W of the equivalent microstrip line becomes about 9 mm by the characteristic impedance $Z_0$. In an embodiment of the invention, therefore, for the purpose of size minimization, the line width W of the microstrip line 1 is set, for example, at 1.0 mm.

Figure 3:
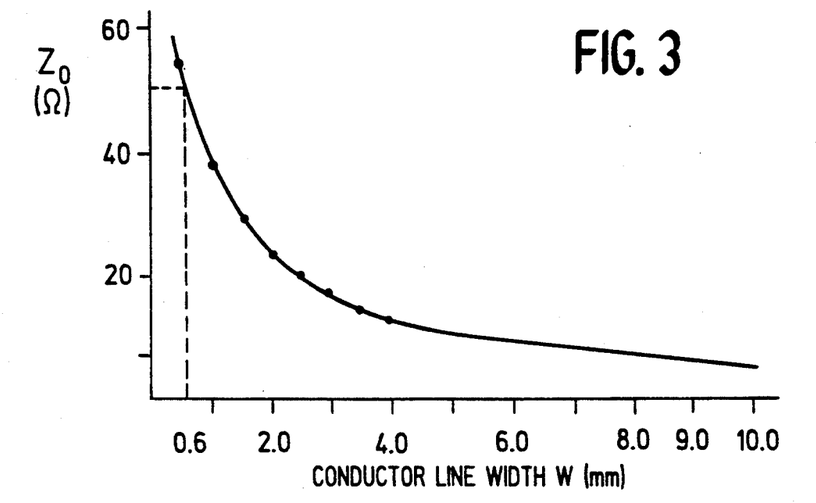
FIG. 3 is a graph showing the relationship between a characteristic impedance $Z_0$ and the line width W of a microstrip line.

By lessening the line width W of the microstrip line 1, as shown in FIG. 3, the characteristic impedance $Z_0$ becomes about 38.80 Ω. Here, characteristic measuring conditions of FIG. 3 are as follows, resonant frequency : 900 MHz, dielectric constant $\epsilon_r$ of substrate 2: 9.6, thickness h of substrate 2: 0.635 mm, and thickness t of microstrip line 1: 14 μm.

Figure 2B:
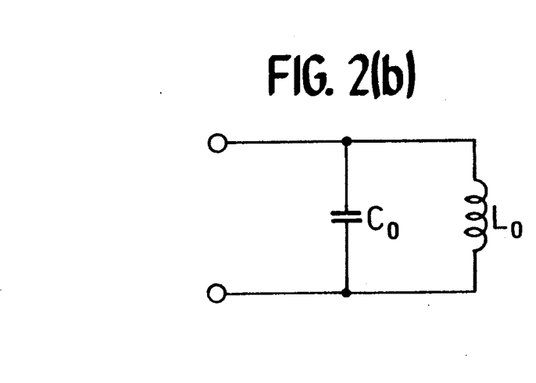
FIG. 2(b) is its equivalent electric circuit.

As such, as shown in FIG. 2(b), the equivalent circuit of the microstrip line 1 whose line width W is minimized, comprises the equivalent inductance $L_0$ and the equivalent capacitance $C_0$. And, the equivalent inductance $L_0$ is, $$L_0 = \frac{2 Z_0}{\pi^2 \cdot f_0} \quad (H) \quad (3)$$

Where,
$Z_0$ = characteristic impedance
$f_0$ = resonant frequency, and the equivalent inductance $L_0$ in the microstrip line 1 whose characteristic impedance $Z_0$ is 38.8 becomes 8.7 nH, which is about six times the characteristic impedance of the conventional dielectric coaxial element 61. Moreover, the conductor resistance of the microstrip line 1 also becomes larger, resulting in a low Q value.

In the aforesaid equation (3), in order to have an aimed characteristic (e.g. 1.55 nH) of the equivalent inductance $L_0$, the resonant frequency $f_0$ may be replaced with the higher resonant frequency $f_1$ in proportion to the characteristic impedance $Z_0$. That is, the resonant frequency $f_1$ may be determined at about 4.7 GHz.

From the equations (1) and (2), the line length l of the microstrip line 1 is, $$l = \frac{c}{4 \cdot f_0 \sqrt{\epsilon_e}} \quad (4)$$

relationship between the parallel resonance Q value and $L_0$ is, $$Z_p Q 2 \pi f_0 L_0 \quad (4)'$$

where,
l: length of microstrip line
c: velocity of light in free space
$f_0$: resonant frequency
$\epsilon_e$: effective relative dielectric constant $Z_p$: impedance at resonance
thus in order to obtain the sufficiently high resonant frequency $f_1$, the length of element or the line length l of the microstrip line 1 may be shortened. Thereby, the line width W of the microstrip line 1 may be minimized to 1.0 mm and the line length l to 6.2 mm.

Though the Q value of the microstrip line 1 may be lowered by reducing the line width W as described above, it is improved from the equation (4') by the design of the line length l, thus the size of the microstrip line 1 can be minimized.

For mounting such a minimized microstrip line 1 to the resonant circuit b, in proportion to the characteristic impedance $Z_0$, an excessively high resonant frequency $f_1$ (4.7 GHz) may be essentially corrected and lowered to the frequency $f_0$ (900 MHz) near the oscillation frequency of the oscillation circuit.

Specifically a correcting means, as shown in a resonant portion R in the broken line of FIG. 1, comprises an additional capacitance component Cx connected to one end of the microstrip line 1 in parallel therewith.

Figure 4:
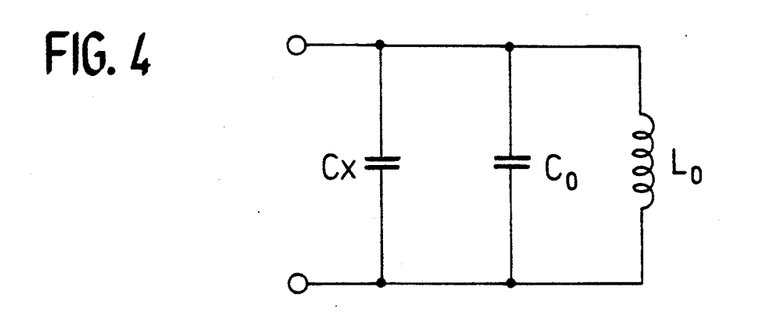
FIG. 4 is an equivalent circuit diagram showing a resonant portion of an oscillation circuit, that is, connecting between a microstrip line and an additional capacitance component.

As shown in the equivalent electric circuit of FIG. 4, an equivalent inductance component $L_0$ at the portion of the microstrip line 1 and an equivalent capacitance component $C_0$ are connected in parallel, and the additional capacitance component Cx is connected in parallel to the equivalent capacitance component $C_0$. Here, the resonant frequency $f_1$ of the microstrip line 1 is m times as high as the frequency $f_0$.

In an equivalent circuit diagram of the composition of the capacitance components $C_0$ and Cx of FIG. 4, the additional capacitance component Cx may be determined such that the resonant frequency $f_0$ of the resonant portion R, including the additional capacitance component Cx and the microstrip line 1, becomes the resonant frequency $f_0$ near the oscillation frequency of the oscillation circuit.

$$f_1 = m f_0 = \frac{1}{2\pi \sqrt{L_0 C_0}} \quad (5)$$

$$f_0 = \frac{1}{2\pi \sqrt{L_0 (C_0 + Cx)}} \quad (6)$$

That is, from the equations (5) and (6), the additional capacitance component Cx may be set as $$Cx = C_0(m^2 - 1)$$

for the capacitance component $C_0$, then the anticipated resonant frequency $f_0$ is achieved, and the resonant portion R (having microstrip line 1), which is characteristically the same or better than the conventional dielectric coaxial resonator at the same resonant frequency thereof, is accomplished.

That is, in the above described embodiment of the invention, size minimization of the microstrip line 1 and improvement of the Q value, by minimizing the line length L and width W of the microstrip line, can be accomplished while the excessively high resulting resonant frequency $f_1$ is corrected and lowered to the resonant frequency near the oscillation frequency of an oscillator by connecting the additional capacitance component Cx. Thereby the minimization of the microstrip line 1, and the minimization of the oscillation circuit, is accomplished while characteristics equivalent to the dielectric coaxial resonator can be readily obtained.

A coefficient m of the resonant circuit frequency (the corrected resonant frequency of a resonator R constituted by the microstrip line 1 and the additional capacitance component Cx) $f_0$ according to an embodiment of the invention and the resonant frequency $f_1$ of the microstrip line 1 is preferably in the range of $2<m<7$.

When the coefficient m exceeds 7, a very precise patterning is required for forming the microstrip line 1, thus becoming unsuitable structurally.

Also, when the coefficient m is below 2, the size of the microstrip line 1 can not be minimized sufficiently as compared with the conventional dielectric coaxial resonator 61, thus one effect of the invention can not be realized.

Next, a conductor loss in the conductivity of the microstrip line 1 is largely due to the line length L and width W of the microstrip line 1.

To show the conductor loss of the microstrip line 1, as shown in an equivalent circuit of FIG. 6, a conductor resistance r is connected to the equivalent inductance component $L_0$ in series. Similar to the case wherein the line width W is narrowed, when the conductor resistance r increases, as shown in FIG. 5, it shows a trend shown by the broken line and the Q value is lowered, eventually lowering a C/N ratio of the oscillation output signal.

In an embodiment of the invention, when forming the microstrip line 1 on a low dielectric constant substrate such as an alumina substrate, a conductor having a metal base of a high conductive material such as silver or copper is desirable. This can be obtained easily by firing a network which is necessary in the oscillation circuit and formed on the alumina substrate, and by printing with, for example, a copper paste in a lump. Thereby the minimized microstrip line 1 can be accomplished by a conventional production process of a thick film electric circuit substrate, thus greatly contributing to the reduction of cost.

Incidentally, in the embodiment described above, though one end of the microstrip line 1 is connected to an additional capacitance in parallel and the other end is electrically grounded, responsive to resonance conditions, the inductance component and the capacitance component may be grounded additionally when necessary.

Also, from the equation (4), though the relative dielectric constant $\epsilon r$ may be raised to shorten the line length L of the microstrip line 1, since a high dielectric constant substrate is relatively expensive, an inexpensive oscillation circuit as with embodiments of this invention may not be constructed.

In an embodiment of the present invention, a resonant portion R may be constituted by the microstrip line 1 and the capacitance component Cx connected to an end of microstrip line 1 in parallel in one unit to form a one piece circuit element. That is, as shown in FIG. 2(a), the microstrip line 1 formed on, for example, an alumina ceramic dielectric substrate 2 which is less expensive and having a low dielectric constant ($r=20$ or less) by printing, is connected to the microstrip line 1 mounted with one piece capacitor Cx, and is shorted to ground conductor 3 formed on the bottom side of the substrate 2 via a through hole 4. Since the resonant portion R is the one piece circuit element, the circuit configuration is easy and the resonant portion R may be constituted by the alumina ceramic 2 with other circuits having a glass epoxy substrate. Thus, a very inexpensive oscillation circuit can be provided.

Figure 10A:
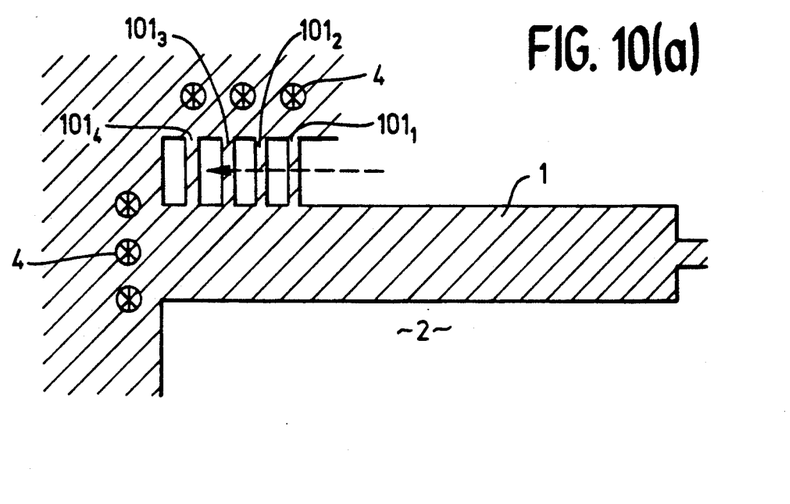
FIG. 10(a) is a plan view of a microstrip line including a short stub used in an oscillation circuit of an embodiment of the invention.
Figure 10B:
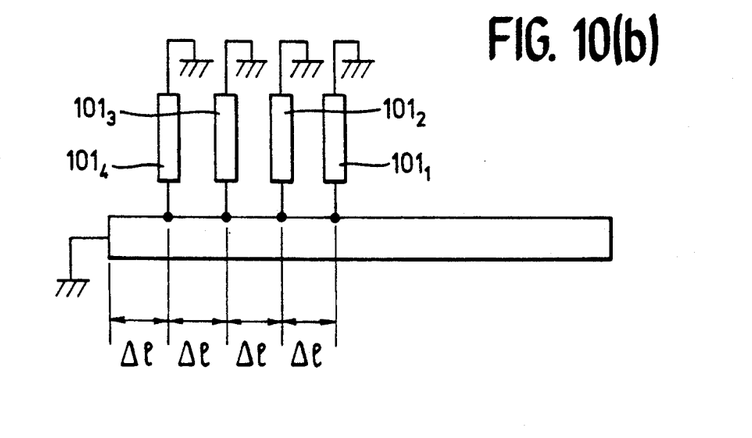
FIG. 10(b) is its equivalent circuit diagram and FIG. 10(c) is a graph showing the relationship between short stub cutting and oscillation frequencies.

Next, frequency adjustment by a short stub of an embodiment of the invention will be explained. In FIG. 10(a), the microstrip line 1 used in an oscillation circuit according to an embodiment of the invention is provided with the short stubs $101_1$, $101_2$, $101_3$, and $101_4$ on one side thereof is shown. As shown in FIG. 2, on the bottom side of the substrate 2 whereon the microstrip line 1 is formed, a ground conductor 3 is formed and one end of the microstrip line 1 is connected to the ground conductor 3 via a through hole 4. When indicating this circuit in an equivalent circuit diagram, as shown in FIG. 10(b), the short stubs $101_1$, $101_2$, $101_3$ and $101_4$ are connected and spaced equally at $\Delta l$. The frequency adjustment is effected by cutting the short stubs $101_1$, $101_2$, $101_3$, $101_4$ by means of a laser or the like in order. In FIG. 10(a), the broken arrow line shows the trimming direction. The relationship between the cutting of the short stubs $101_1$, $101_2$, $101_3$, $101_4$ and frequencies is as shown in FIG. 10(c), in which it is shown that the frequency becomes lower as the cutting of the short stub 101 proceeds as $101_1$, $101_2$, $101_3$ and $101_4$.

Figure 10C:
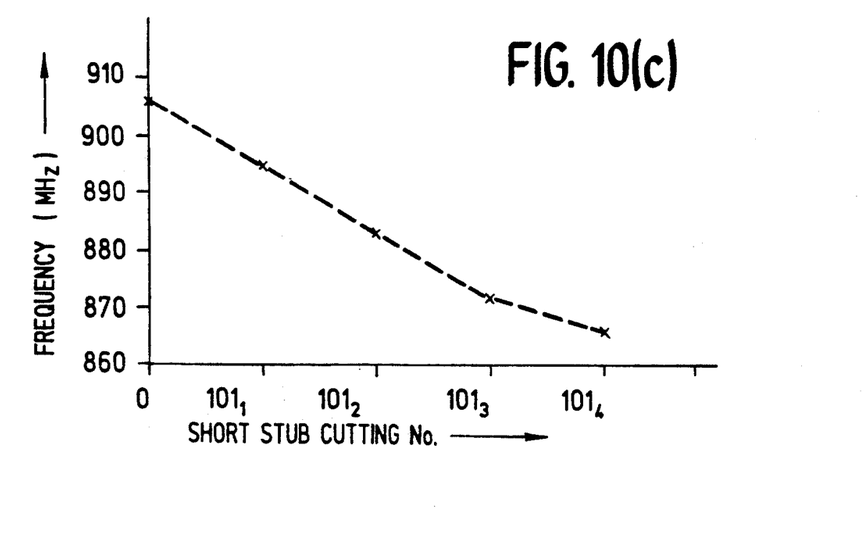

In the frequency adjustment, whenever the short stubs $101_1$, $101_2$, $101_3$, $101_4$ are cut, the frequency changes linearly at the same changing factor as shown in FIG. 10(c). Also, by selecting the width and space of the short stub 101, any frequency changing ratio may be set. Furthermore, the frequency can be adjusted without deteriorating the performance of the oscillation circuit such as C/N. Besides, the short stub 101 can be trimmed continuously by the laser or the like for frequency adjustment, which may be readily effected.

Figure 11A:
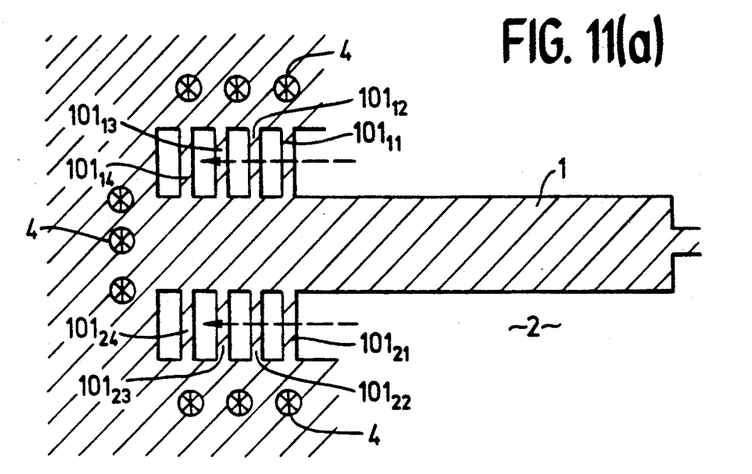
FIG. 11(a) is a plan view of a microstrip line including a short stub used in an oscillation circuit of an embodiment of the invention.
Figure 11B:
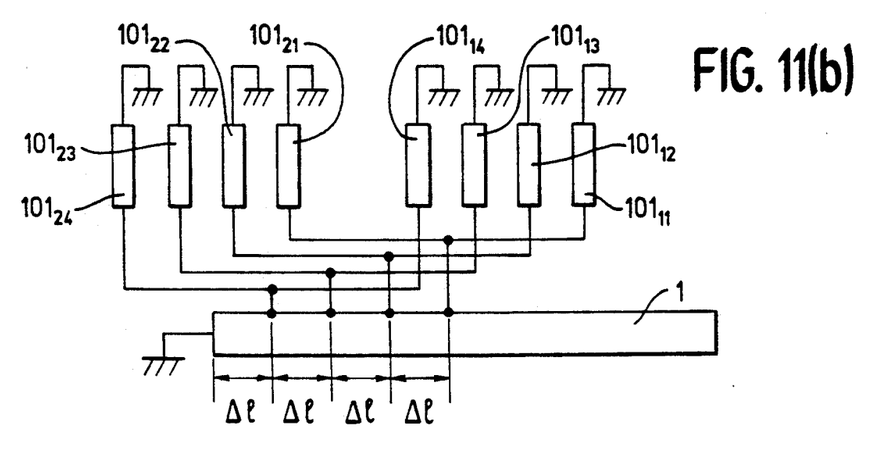
FIG. 11(b) is its equivalent circuit diagram and FIG. 11(c) is a graph showing the relationship between short stub cutting and oscillation frequencies.
Figure 11C:
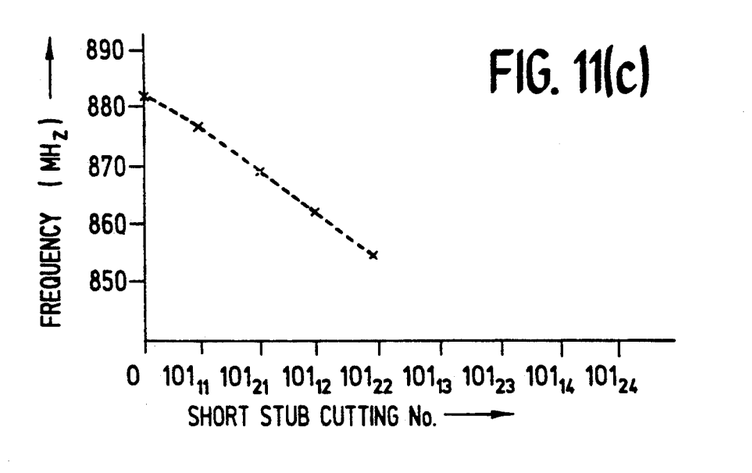

In FIG. 11(a), short stubs $101_{11}$, $101_{12}$, $101_{13}$, $101_{14}$, $101_{21}$, $101_{22}$, $101_{23}$, $101_{24}$ are provided on both sides of a microstrip line 1 used in the oscillation circuit of an embodiment of the invention. The short stubs may be cut successively and alternately in such a manner that the short stub $101_{11}$ on one side is cut and then the short stub $101_{21}$ on the other side i cut. An equivalent circuit diagram for this circuit is shown in FIG. 11(b), in which it is shown that the frequency lowers gradually as the cutting of the short stub 101 proceeds as $101_{11}$, $101_{21}$, $101_{22}$, $101_{13}$, . . .

This example is applicable in the case wherein the space between the short stubs 101 is limited from the productive aspect, or the frequency change is made little by little, the frequency change may be made about one half of that of the previous example.

Figure 12A:
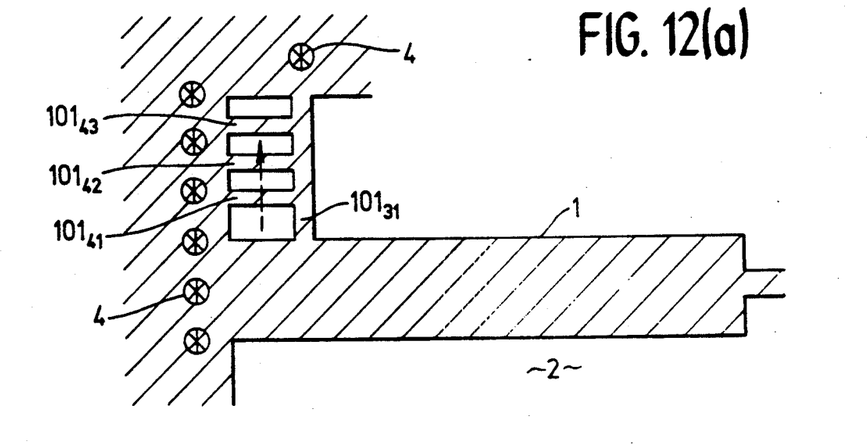
FIG. 12(a) is a plan view of a microstrip line including a short stub used in an oscillation circuit of an embodiment of the invention.
Figure 12B:
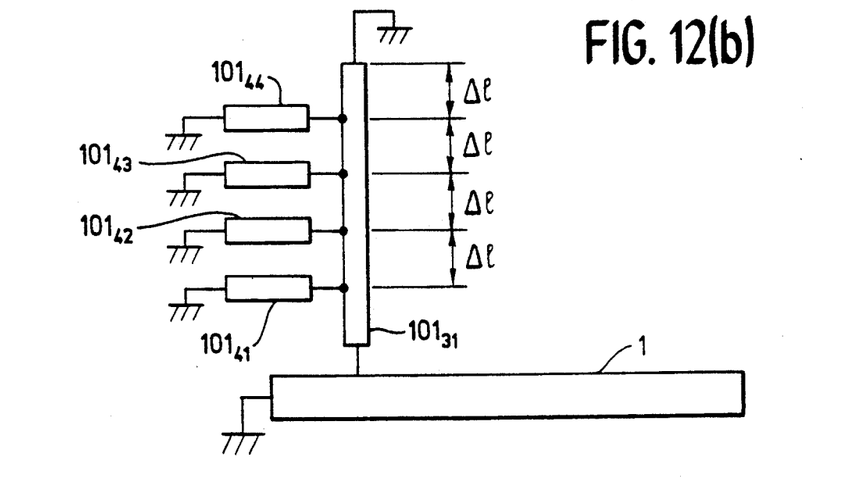
FIG. 12(b) is its equivalent circuit and FIG. 12(c) is a graph showing the relationship between short stub cutting and oscillation frequencies.
Figure 12C:
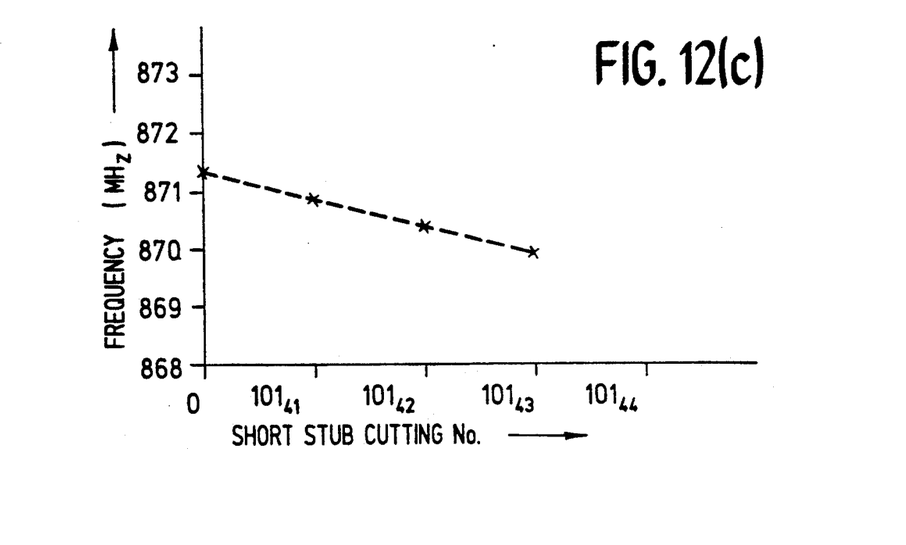

In FIG. 12(a), one short stub $101_{31}$ is provided on the side of the microstrip line 1 used in an oscillation circuit of the invention, and further short stubs $101_{41}$, $101_{42}$, $101_{43}$, $101_{44}$ are provided on the side of the short stub $101_{31}$ in the equally spaced relation. The frequency is adjusted by cutting the short stubs $101_{41}$, $101_{42}$, $101_{43}$, $101_{44}$ in order. An equivalent circuit diagram for this circuit is shown in FIG. 12(b). The frequency change is shown exemplarily in FIG. 12(c).

This frequency adjustment is suitable for the case such as circuit assembling where the frequency variations are small and the fine adjustment is necessitated.

Figure 13:
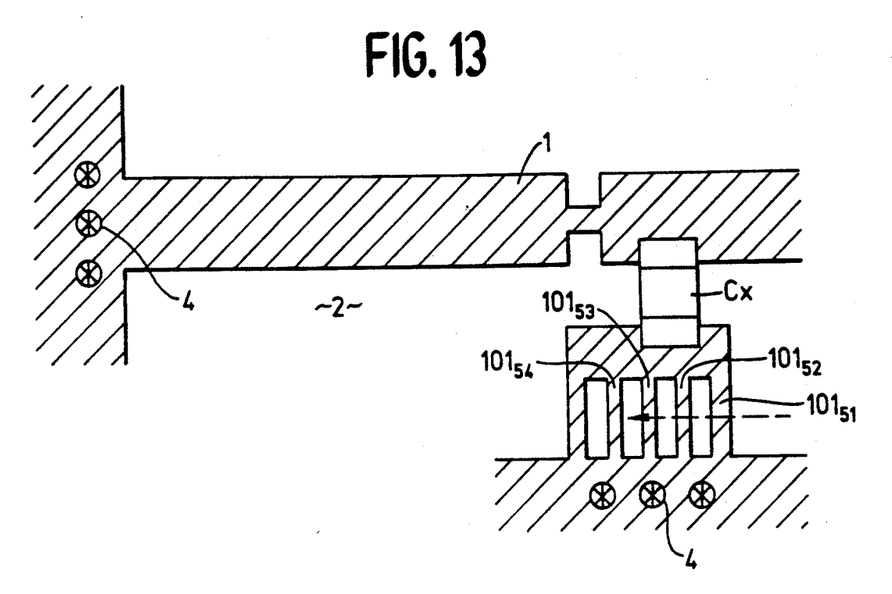
FIG. 13 is a plan view in which an electrode is provided on the ground side of an additional capacitance component connected to a microstrip line used in an oscillation circuit of an embodiment of the invention, and any number of short stubs are connected from the electrode at equal intervals.

In FIG. 13, an electrode is provided on the ground side of an additional capacitance component Cx added to the microstrip line 1 used in an oscillation circuit according to an embodiment of the invention. Any suitable number of short stubs $101_{51}$, $101_{52}$, $101_{53}$, $101_{54}$ . . . extend from the electrode at an equal interval.

For frequency adjustment, whenever the short stubs $101_{51}$, $101_{52}$, $101_{53}$, $101_{54}$ are cut, the frequency changes linearly in the same changing ratio. Also, by selecting the width and distance of the short stub 101, any frequency changing ratio may be set. Furthermore, the frequency can be adjusted without deteriorating the performance of the oscillation circuit such as C/N. Besides, the short stub 101 can be trimmed continuously by the laser or the like for frequency adjustment, which may be effected easily.

Figure 14:
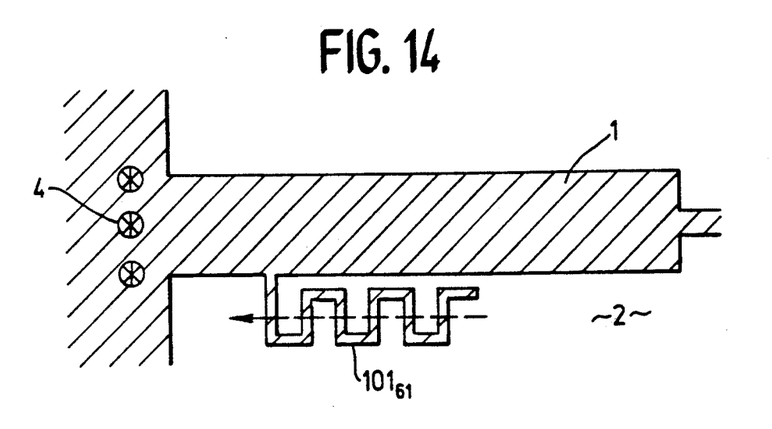
FIG. 14 is a plan view of a microstrip line including a zigzagged open stub used in an oscillation circuit of an embodiment of the invention.

In FIG. 14, a zigzagged open stub $101_{61}$ provided on the side of the microstrip line 1 used in an oscillation circuit of an embodiment of the invention is shown. The open stub $101_{61}$ is cut successively from the open end.

In the frequency adjustment, since the open stub $101_{61}$ is zigzagged the cutting may be effected continuously, and hence is easily effected. Also, whenever the zigzagged open stub $101_{61}$ is cut, the frequency changes linearly. Furthermore, by selecting the zigzagged length of the open stub $101_{61}$, any frequency changing ratio may be set. Since the frequency is adjusted by cutting the open stub $101_{61}$, it may be adjusted without deteriorating the performance of the oscillation circuit.

Figure 16:
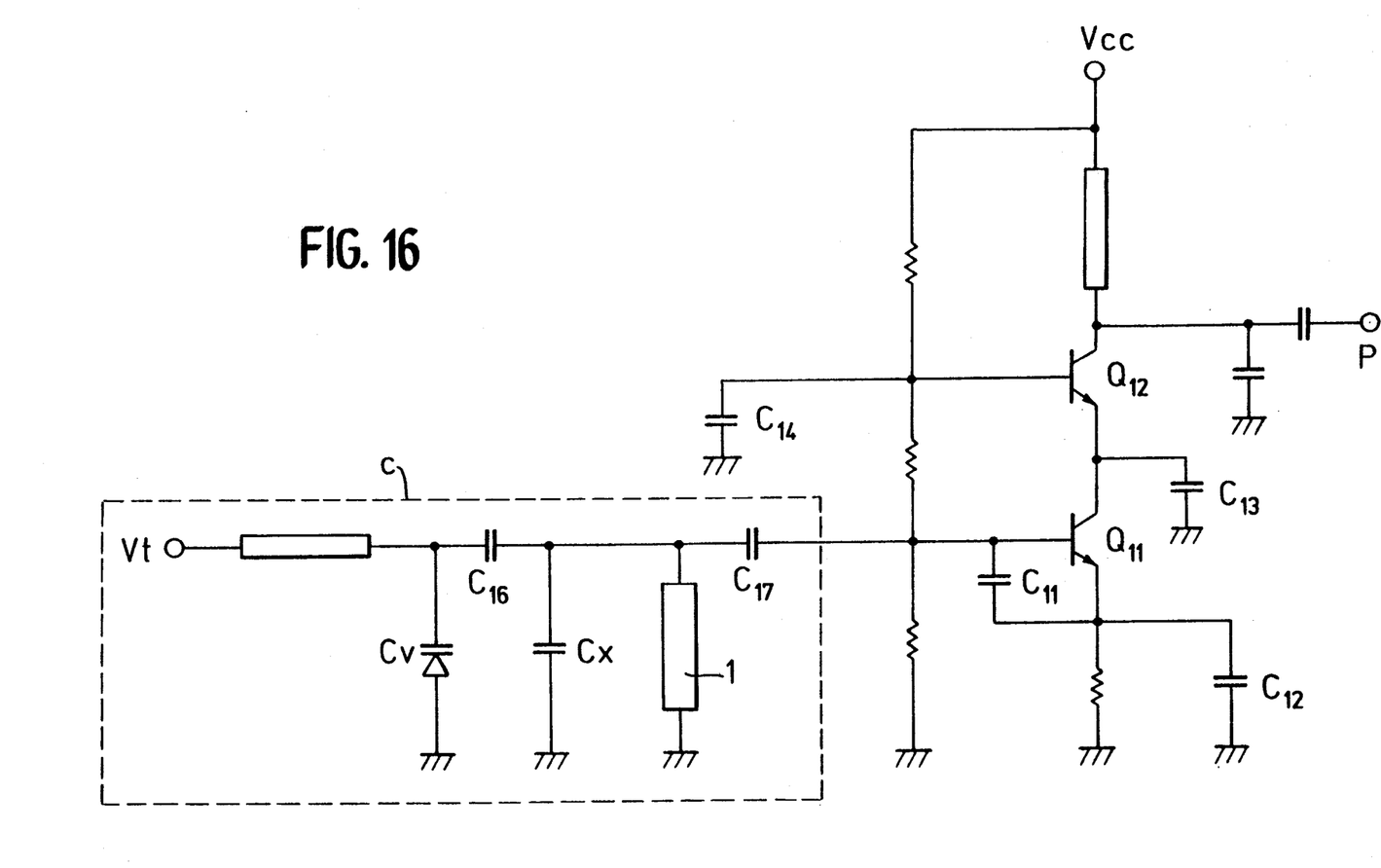
FIG. 16 is a circuit diagram of an oscillation circuit to which a cascode connecting amplifier of an embodiment of the invention is connected.

Next, an oscillation circuit in which a cascode connecting amplifier according to an embodiment of the invention is connected will be described. The cascode connected amplifier lessens the oscillation frequency fluctuations due to load variations.

Figure 15:
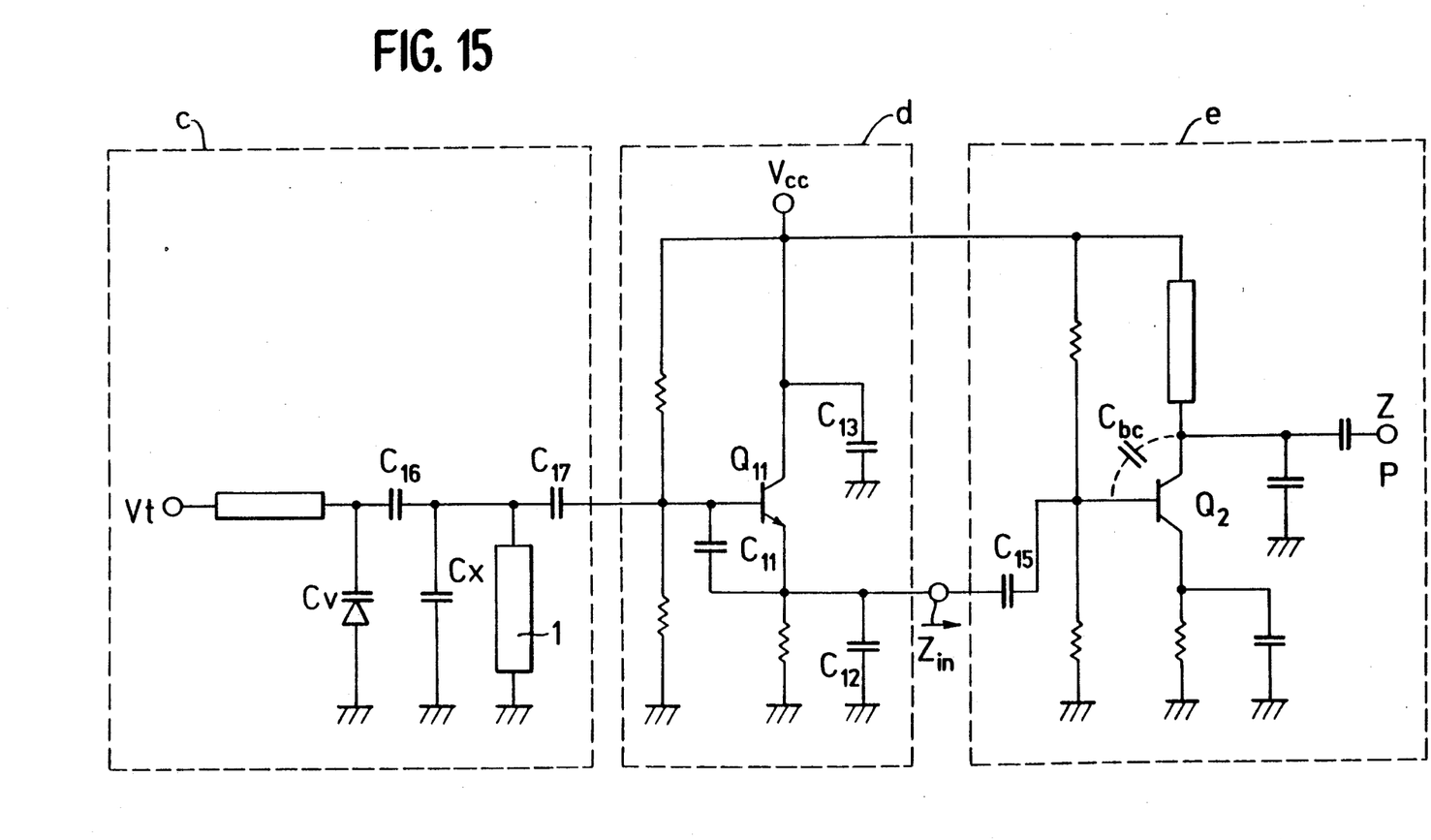
FIG. 15 is a circuit diagram of a conventional oscillation circuit.

FIG. 15 is an electric circuit diagram of a VCO having a conventional resonant circuit.

The electric circuit diagram comprises an oscillation circuit consisting of a resonant circuit c and a negative resistance circuit d and an amplifying circuit e which amplifies the level.

The resonant circuit c comprises a microstrip line 1, an additional capacitance Cx, a variable capacitor Cv whose capacitance varies by control voltages, a capacitor $C_{16}$ for determining the variable range of the voltage control oscillation frequency and a clap capacitor $C_{17}$. A terminal Vt of the resonant circuit c is a control voltage terminal.

The negative resistance circuit d is collector grounded by constituting an oscillating transistor $Q_{11}$ by a bypass capacitor. A terminal Vcc is a power terminal.

The amplifying portion e is constituted by emitter grounding of a transistor $Q_{12}$ and a terminal P is an output terminal.

Since this amplifying portion e is used such that the oscillation frequency condition of the oscillation circuit is not influenced by the impedance condition of a load circuit to be connected, it is also called a buffer amplifier.

In practical use, however, it does not function perfectly by the following reasons.

In the amplifier circuit e of FIG. 15, the amplifying transistor $Q_{12}$ is constituted by the emitter grounding. In such a circuit, an input impedance $Z_{in}$ of the amplifying circuit e is influenced by a capacitance $C_{bc}$ between the base and the collector of the transistor $Q_{12}$. The input impedance $Z_{in}$, therefore, changes in proportion to the variation of a load impedance Z (generally referred to as the Miller effect). The input impedance $Z_{in}$ is connected to a portion which determines the oscillation frequency in the oscillation circuit of FIG. 15, so that the variation of the input impedance $Z_{in}$ is nothing but the oscillation frequency fluctuation.

FIG. 16 shows a circuit diagram in which the aforementioned problems are alleviated.

In a circuit of FIG. 16, similar to FIG. 15, an oscillation circuit c comprises: a microstrip line 1, an additional capacitance Cx, a variable capacitor Cv whose capacitance changes by control voltages, a capacitor $C_{16}$ for determining the variable range of the voltage control oscillation frequency, a clap capacitor $C_{17}$ and so on, and a terminal Vt as a control voltage terminal. On the upper step of the oscillating transistor $Q_{11}$, the amplifying transistor $Q_{12}$ is connected in cascode. The base of transistor $Q_{12}$ is grounded in a high-frequency mode via the bypass capacitor, $C_{14}$. The base-ground type transistor $Q_{12}$ is coupled to a front step or oscillating step by an emitter. This method of connecting the amplifier is generally called a cascode connection.

A terminal Vcc is a power terminal and a terminal P is an output terminal.

In a circuit shown in FIG. 16, oscillation conditions are satisfied when the oscillating transistor $Q_{11}$ is collector grounded. Accordingly, a capacitor $C_{13}$ must be a bypass capacitor. However, when grounding with the capacitor $C_{13}$ perfectly in a high frequency mode, the signal can not be transmitted to the amplifier circuit. Accordingly, the capacitor $C_{13}$ which satisfies the oscillating conditions of the oscillating portion must be selected. An emitter input of the amplifying portion viewed from the collector side of the transistor $Q_{11}$ in the oscillating portion shows a substantially low impedance. When the value of the capacitor $C_{13}$ is selected somewhat larger in this state, it is in a sufficient range for oscillation. However, when the capacitor $C_{13}$ is set too largely, the signal level may attenuate, so that the value of the capacitor $C_{13}$ is set such that the oscillation takes place fully stably within the range so as to avoid attenuating the signal level.

As described above, since the impedance of the input side (emitter side) of the amplifier is substantially lower, fluctuations due to the variation of load impedance connected to the output side of the amplifier are small. Also, since the connection is made to the collector in the oscillation circuit and the oscillation circuit operation comprises grounding the collector, a load impedance fluctuation does not influence the oscillation frequency much.

As aforementioned, by the cascode connection, no matter to what circuit the oscillation circuit is connected, or under any fluctuations of the load impedance, the oscillation frequency varies very little.

INDUSTRIAL APPLICABILITY

As described above in detail, an embodiment of the present invention is directed to an oscillation circuit comprising, a resonant circuit having a microstrip line and a negative resistance circuit having an active element, in which the microstrip line is constituted by minimizing the line width and length to form a high conductivity conductor on a low dielectric constant substrate, one end of the microstrip line is grounded, the other end thereof is connected in parallel to a capacitance component, said microstrip line is resonated at a substantially higher resonant frequency than the oscillation frequency of the oscillation circuit, and said resonant frequency is lowered to the proximity of the oscillation frequency of the oscillation circuit by the capacitance component, so that disadvantages of a resonator used in a conventional high frequency oscillator, namely, the disadvantages of using the microstrip line such as the difficulty in minimization and the deterioration of Q value can be solved and prevented completely without degrading its characteristics, and furthermore, the disadvantages of using a dielectric coaxial resonator such as a large-sized oscillation circuit, including relatively high parts costs and mounting cost can be avoided completely.

In an embodiment of the invention, since the microstrip line and a capacitance component which is connected in parallel to the other end of the microstrip line are made as one piece circuit elements, the circuit can be constructed easily and when a dielectric substrate is formed with a low dielectric, a resonator may be provided at a relatively low cost.

Furthermore, in an embodiment of the invention, a stub is connected to the microstrip line and is trimmed to adjust the oscillation frequency, such that the oscillation frequency can be adjusted simply and accurately.

Moreover, a cascode amplifying portion is connected to a negative resistance circuit, according to an embodiment of the invention, such that the oscillation frequency fluctuation due to load variations may be reduced.

What is claimed is:

1. An oscillation circuit comprising:
   a resonant circuit having a microstrip line; and
   a negative resistance circuit having an active element;
   said microstrip line including a high conductivity conductor having a minimized line width and length and a low dielectric constant substrate on which said high conductivity conductor is disposed;
   said microstrip line having one grounded end and another end connected to an additional capacitance component;
   said microstrip line having a resonant frequency set at a substantially higher frequency than the oscillation frequency of the oscillation circuit, and said substantially higher resonant frequency being lowered to the proximity of the oscillation frequency of the oscillation circuit by said additional capacitance component.

2. An oscillation circuit in accordance with claim 1, wherein said microstrip line and said additional capacitance component connected to said microstrip line are a one piece circuit element.

3. An oscillation circuit in accordance with claim 1, wherein a connecting conductor connects said additional capacitance component with said microstrip line and wherein a stub is connected to at least one of said microstrip line and said connecting conductor such that said stub may be trimmed to adjust the oscillation frequency.

4. An oscillation circuit in accordance with claim 1, wherein a cascode amplifying portion is connected to said negative resistance circuit.

* * * * *